United States Patent [19]

Friedel et al.

[11] Patent Number: 5,001,403
[45] Date of Patent: Mar. 19, 1991

[54] METHOD AND APPARATUS FOR CENTERING AN ELECTRON BEAM

[75] Inventors: Wolfgang Friedel, Feldkirch, Austria; Helmut Kaufmann, Triesen, Liechtenstein; Roland Schmid, Göfis, Austria

[73] Assignee: Balzers Aktiengesellschaft, Balzers, Liechtenstein

[21] Appl. No.: 465,022

[22] Filed: Jan. 16, 1990

[30] Foreign Application Priority Data

Feb. 9, 1989 [CH] Switzerland .............................. 455/89

[51] Int. Cl.⁵ .............................................. H01J 29/54
[52] U.S. Cl. .................................. 315/398; 219/121.15
[58] Field of Search ................. 315/398; 204/198.04, 204/198.16, 198.2, 198.22, 192.12; 427/35, 38, 42; 219/121.15

[56] References Cited

U.S. PATENT DOCUMENTS 4,853,514  8/1989  Lemelson .................. 219/121.15

*Primary Examiner*—Theodore M. Blum
*Attorney, Agent, or Firm*—Notaro & Michalos

[57] ABSTRACT

A method and apparatus centers of an electron beam (3) in a surface coating installation with movable substrates. A rotating magnetic field is superimposed on a main magnetic field which serves to guide and focus the electron beam. A focal spot of the electron beam is thus caused to rotate about a theoretical axis (17) of the electron beam (3) and the beam sweeps the entire surface (32) of a raw material source (4). Changes in the consumption of reactive gas supplied to the installation are measured by a flowmeter (21). Through a control unit (20) connected to the flowmeter, stationary magnetic fields are superimposed on the rotating magnetic field and the electron beam (3) is aimed at the center of the surface (32) of the raw material source (4) as a function of variations in the reactive gas flow.

11 Claims, 2 Drawing Sheets

METHOD AND APPARATUS FOR CENTERING AN ELECTRON BEAM

FIELD AND BACKGROUND OF THE INVENTION

The present invention relates to a method for centering an electron beam in vacuum coating installations, where the electron beam is guided in a vacuum chamber from a cathode to a raw material source. A focusing field is produced for directing the electron beam to the surface of the raw material source which is thereby heated and melted down. The raw material source is moved up to follow this melt-down. The invention also includes an apparatus for the execution of the method.

Several methods are known for making possible the vaporization of coating materials and for coating the surfaces of substrates with these materials in a vacuum chamber. It is also known to introduce into the vacuum chamber additional reactive gases, such as nitrogen or oxygen, whereby surface coatings of respective compounds result. In German patent document 28 23 876 such a method and apparatus are described. In this reference a substrate carrier for carrying the parts to be coated is arranged concentrically around the main axis in a vacuum chamber. The parts to be coated may include such tools as milling cutters or drills or other objects that are to be provided with a surface coating that is to have special mechanical, chemical or optical properties. In the center of the installation, an electron beam originating from a cathode arrangement and impinging on a raw material source, is guided along the longitudinal axis of the vacuum chamber. Due to the high energy of the electron beam, the surface of the raw material source is fused and the fused raw material is applied onto the substrate by the method described.

By means of a magnetic field the electron beam is focused and aimed at the center of the raw material source. The substrate carrier and the objects to be coated which are disposed on the substrate carrier, disturb this magnetic field. These disturbances cause the electron beam to be deflected and therefore the raw material source is no longer acted upon in the desired manner. Additional difficulties result if the substrate carrier or the objects to be coated are rotated or otherwise moved during the coating process. In this case the influences on the magnetic field change continuously, and the electron beam is deflected and disturbed unevenly. As a result, the raw material source is acted upon and fused unevenly. Also, the focal spot produced by the electron beam on the source may, in an extreme case, impinge outside the source and onto the surrounding mount, and this may lead to corresponding temperature rises and, if cooling is insufficient, to damage to these parts of the installation.

In the known apparatus a raw material source is used which is disposed in a crucible and can contain only a certain quantity of coating material.

For installations with a high vaporization rate it is known also to use, as the raw material source, a billet or bar which can be moved up continuously through the bottom of the crucible. This raw material bar forms the anode, and with the magnetic field uninfluenced, the focal spot formed by the electron beam impinges on the center of the raw material bar and causes uniform melting of its surface. If the electron beam is deflected from the center, the bar melts down on one side, forming a unilateral pasty collar. This unilateral collar is also cooled less well, as it is farther away from the cooled mount. The pasty part of the collar reacts with the reactive gas present in the vacuum chamber, and the resulting compound usually has a higher melting point than the pure material. This also leads to disturbances in the coating process, as thereby the vaporization rate is changed and the melt-down process disturbed. The consequence of this may be that the coating process must be interrupted and the object to be coated may be of inferior quality or must even be discarded.

SUMMARY OF THE INVENTION

It is an object of the present invention to provide a method and an apparatus whereby the electron beam can be centered during the coating process and a uniform melt-down process at the surface of the raw material source is produced, and which can be used in known installations and methods in a simple manner.

Another object of the present invention is to provide a method and an apparatus for centering an electron beam which is guided on a beam axis in a vacuum chamber of a vacuum coating installation, from a cathode to the surface of a raw material source in the chamber, the beam producing a focal spot on the surface of the raw material which is heated and melted down at a vaporization rate, the raw material source having a source axis and being moved up in accordance with the melting down of the raw material source, the method comprising, producing a magnetic field which is approximately at a right angle to the beam axis, rotating the magnetic field in a plane lying approximately at a right angle to the beam axis for rotating the electron beam about a rotation axis which is approximately parallel to the beam axis, measuring variations in the vaporization rate of the raw material source, and bringing the rotation axis of the electron beam into coincidence with the source axis as a function of the vaporization rate.

In the method according to the invention, the deflection of the electron beam from the ideal axis caused by the substrate holder and the substrates, or by their influence on the main magnetic field, can be corrected. This occurs due to the fact that perpendicular to the axis of the electron beam a rotating magnetic field is produced which lets the electron beam rotate about an axis of rotation with a certain radius. The rotating magnetic field is produced by means of two magnet coils which are offset by 90°, and which are powered by alternating current which is phase-shifted by 90°. The axes of the two magnet coils are approximately at right angles to each other and lie in a plane extending approximately at right angles to the axis of the electron beam. Superimposed on the rotating magnetic field, additional stationary magnetic fields serving for additionally influencing and positioning the electron beam, can be produced on the same axes on which the magnet coils for the rotating magnetic field are arranged. These additional stationary magnetic fields make it possible to shift the axis of rotation about which the electron beam rotates, in the coordinate system formed by two axes of the magnet coils, until, in the ideal case, the axis of rotation has been brought into coincidence with the axis of the raw material source. The vaporization rate of the raw material fused by the electron beam is measured indirectly through the consumption of reactive gas. This reactive gas serves to produce layers of metal compounds resulting from a reaction between the raw material and the reactive gas. It is thus possible to produce nitride, carbide, boride or oxide layers.

The method and equipment of the invention are especially suitable for carbide coating, using, in a known manner, reactive gases such as acetylene, methane, and other gases. If in operation, the electron beam does not fall on the center of the raw material source, then the axis of rotation about which the electron beam is rotated will lie outside the axis of the raw material source. Due to this, the electron beam will not sweep the entire surface of the raw material source, which will then be fused or removed unevenly. In those areas where in the extreme case, the electron beam does not fall on the raw material source at all, a reduced portion of material is vaporized at that moment as compared with the average. If the electron beam falls completely on the surface of the raw material source, the vaporization rate rises appreciably. At an increased vaporization rate more raw material reacts with the reactive gas, and the consumption of reactive gas rises. This is determined by means of a sensor system, and more reactive gas is supplied to the installation. This extra consumption of reactive gas is transformed into a measuring signal and supplied to a control unit in which the respective signal values for increased and reduced consumption are compared with the alternating current signals of the magnet coils that produce the rotating magnetic field. On the basis of this time-related comparison it can be determined in what direction the axis of rotation of the electron beam is deflected in the coordinate system of the magnet coils. In accordance with the deflection found, a stationary magnetic field is superimposed on the rotating magnetic field, and the rotating electron beam with its axis of rotation is shifted in the direction of the axis of the raw material source until the axis of rotation coincides with the axis of the raw material source. This method permits automatic control of such surface coating installations in which the electron beam is deflected from the optimum position by the substrates or substrate holders in the vacuum chamber. As the method and apparatus of the invention are self-regulating, no adjustments are necessary when other substrates or other arrangements are used in the area of the substrate carrier.

By causing the electron beam to rotate about an axis, it is possible to sweep the whole surface area of the raw material source with a relatively small diameter of the electron beam and to obtain a uniform melting and vaporization rate. This arrangement makes it possible also to use raw material sources which can be moved up continuously depending on the melt-down or vaporization rate. This permits longer batch times and fewer interruptions for reloading raw material. Substantially more material can be vaporized and applied on the substrates during one work cycle. The method according to the invention and the respective apparatus thus permit a more economical use of such installations and increase the quality of the coatings, as compounding of insufficiently heated edge regions of the raw material source with the reactive gases is prevented.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENT

Figure 1:
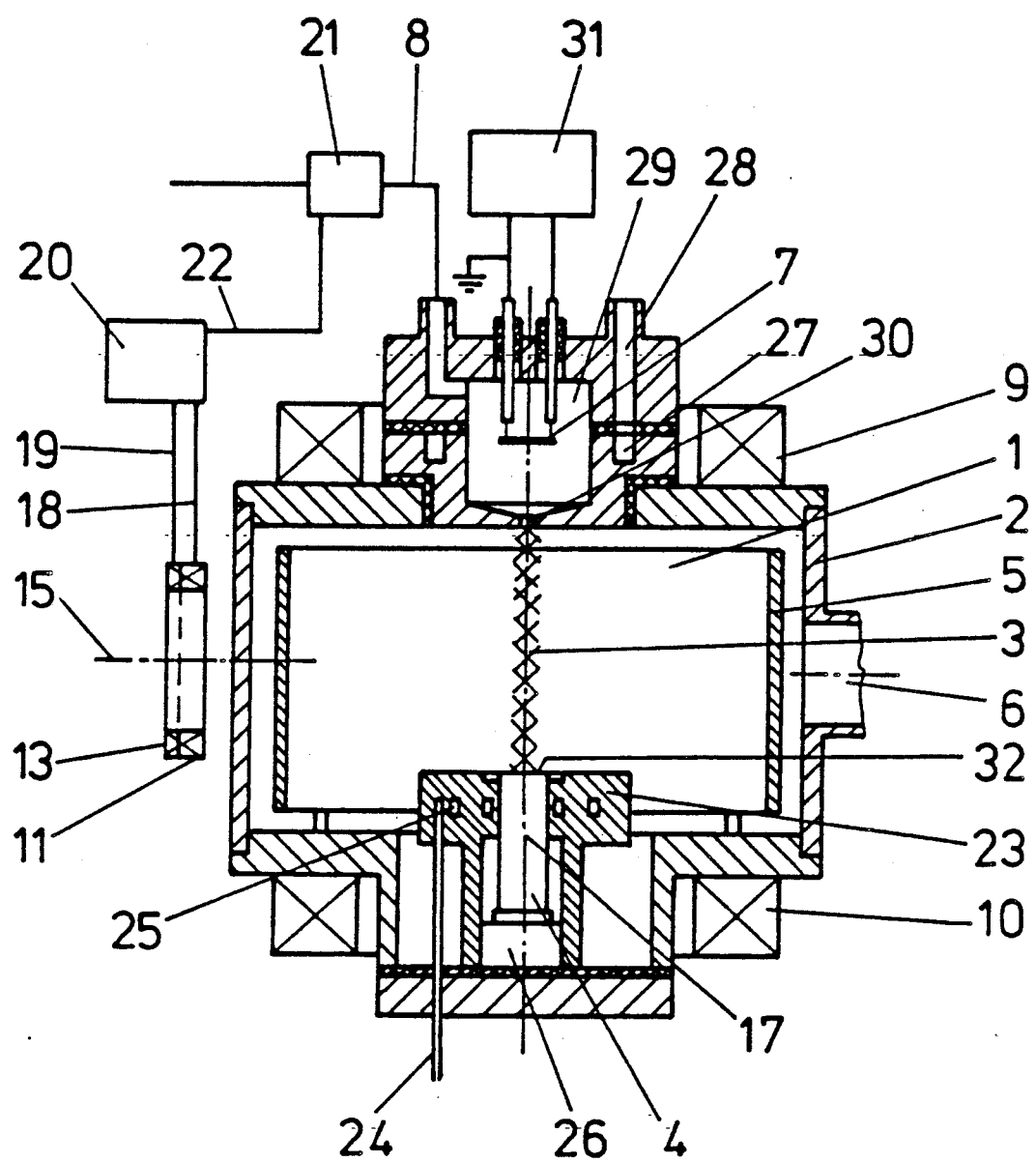
FIG. 1 is a schematic longitudinal sectional view taken through a vacuum coating installation according to the invention.
Figure 2:
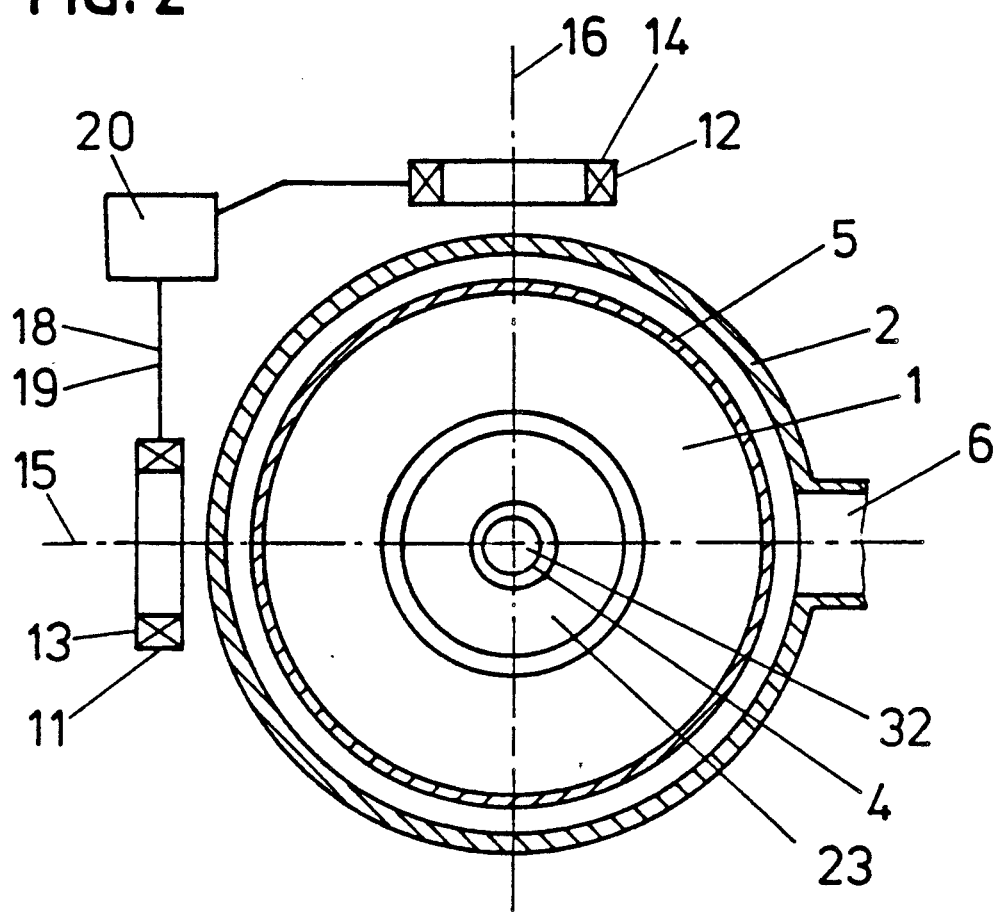
FIG. 2 is a transverse sectional view taken through the vacuum chamber of the vacuum coating installation of FIG. 1.

The vacuum coating installation of FIGS. 1 and 2 comprises a housing 2 embracing a vacuum chamber 1. In this vacuum chamber 1 is arranged a substrate carrier 5. Objects to be fastened to carrier 5 may be movable in a manner which is not shown, to ensure optimum coating of their surface. At the upper part of the housing 2 is a hot cathode chamber 29, with a cathode 7 and respective energy supply devices 31. The hot cathode chamber 29 is connected to the vacuum chamber 1 through an opening 30. At the bottom of the vacuum chamber 1 is a raw material source 4, which is guided and held in a cooling collar 23. This raw material source 4 is rod-shaped and can be moved up in accordance with the amount of material melted down and vaporized. To this end, a feed device 26 is installed below the raw material source 4. The cooling collar 23 is equipped with coolant channels 25 communicating with coolant lines 24.

On the housing 2 an evacuation connection 6 is provided, through which the desired vacuum can be created in the vacuum chamber 1. A connection for a reactive gas line 8 is provided in the zone of the cathode chamber 29. Reactive gases such as acetylene, nitrogen or oxygen are supplied over line 8 and combine with the vaporization material in a known manner. If, for example, a raw material source 4 of titanium is used and nitrogen is supplied over the reactive gas line 8, it is possible to obtain titanium nitride coatings or, if acetylene is supplied, titanium carbide coatings which are especially suitable as tool coatings. In the region of the cathode chamber 29 the housing is also equipped with cooling channels 27 which are supplied with coolant via coolant lines 28.

An election beam 3 is produced between cathode 7 and the exposed surface 32 of the raw material source 4, during operation of the installation.

The electron beam 3 fuses the surface 32 of the raw material source 4 and vaporizes the material thereof into the vacuum chamber 1. Magnet coils 9 and 10 are mounted on housing 2 for producing a magnetic field which is parallel to the axis 17 of the electron beam 3. By means of this magnetic field the electron beam 3 is focused and guided. The flux of the magnetic field produced by coils 9 and 10 is influenced depending on what the substrate carrier 5 is fitted with and depending on the form and size of the substrates or objects to be coated. Due to this, the electron beam 3 is deflected from the theoretical axis 17. As a result, the focal spot produced by the electron beam 3 on the surface 32 of the raw material source 4 is no longer at the center of the raw material source 4 and thereby an uneven melt-down of the raw material source 4 occurs. As a result, pasty edge regions of source 4, which are insufficiently heated, react with the reactive gas and thereby form compounds which fuse only at a higher melting point. This impairs the operation and efficiency of the coating installation considerable. After a certain time, upward movement of the raw material source 4 by means of the feed device 26 must be interrupted, because too high a collar forms in that region of the surface 32 of the raw material source 4 which is no longer being heated correctly by the electron beam 3.

To prevent these disturbances, the device according to the invention has additional first magnet coils 11 and 12 and second magnet coils 13 and 14. In the illustrated example, these magnet coils are mounted outside the housing 2, namely in a plane which is approximately at right angles to the axis 17 of the electron beam 3. The axes 15 and 16 of coils 11 and 12 lie in the same plane and are at an angle of 90° to each other. By means of the two coils 11, 12 a rotating magnetic field is produced, namely in that these two coils 11, 12 are fed via lines 18 with a.c. voltages and current which are phase-shifted by 90°. By means of this rotating magnetic field the electron beam 3 is set in circular or rotational motion and the surface 32 of the raw material source 4 is no longer impinged by the focal spot of the electron beam 3 at only one point, but as a result of the rotational motion, a larger surface area is acted upon.

If the melt-down process at the surface 32 of the raw material source 4 is uneven, the melt-down rate or vaporization rate increases when the focal spot of the electron beam 3 falls on a region of the surface 32 which is superelevated, that is a region which lies closer to the cathode 7. The superelevated region of the surface 32 also lies farther away from the cooling collar 23 and therefore is cooled less. Due to the higher vaporization rate, more reactive gas is consumed in the vacuum chamber 1. The consumption of reactive gas is measured with a flowmeter 21 shown in FIG. 1, and respective deviations are detected. This flowmeter 21 is an integral part of a gas regulating system (not shown) for the reactive gas, which provides for a constant concentration of the reactive gas in the vacuum chamber 1. The signals of the flowmeter 21 are supplied via a connecting line 22 to a control unit 20. Control unit 20 controls and regulating the a.c. voltage of the two magnet coils 11 and 12. In the control unit 20, the flowmeter signal is compared by means of known electronic circuits as a function of time with the a.c. signals of the magnet coils 11 and 12, thereby determining at which points of the coordinate system formed by the axes 15, 16 higher or lower vaporization rates occur. Depending on these findings, there is superposed on the rotating magnetic field on the axis 15 and/or 16 a stationary magnetic field which additionally deflects the electron beam 3, the rotational motion of the electron beam 3 being maintained. The superposition of the stationary magnetic field is effected by additional second magnet coils 13, 14 which are arranged parallel to the magnet coils 11, 12. These second magnet coils 13, 14 may alternatively by integral parts of the first magnet coils 11, 12. The build-up of the superposed stationary magnetic field occurs by powering coils 13, 14 with d.c. signals which also are delivered by the control unit 20 and conducted via lines 19 to the coils. It is the object of the centering method to center the electron beam 3 so that the axis of rotation 34 about which beam 3 rotates coincides or is brought into conincidence with the longitudinal axis 33 of the raw material source 4 as shown in FIG. 3.

Figure 3:
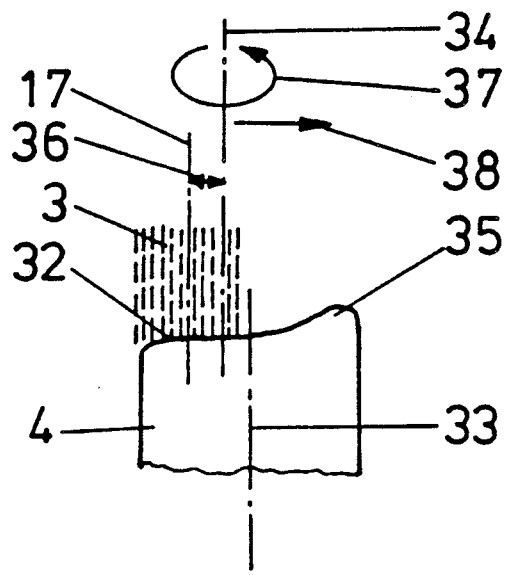
FIG. 3 is an explanatory diagram showing the basic arrangement of the motions and axes at the raw material source.

In FIG. 3, the succession of the processes in the region of the surface 32 of the raw material source 4 is illustrated in principle. The electron beam 3 with its beam axis 17 rotates in the direction of arrow 37 with a radius 36 about the axis of rotation 34. After a rotational motion of 180° from the position shown in FIG. 3, the focal spot of the electron beam 3 impinges on the elevated region 35 of the surface 32 and more material of the raw material source 4 is vaporized. This is established by way of the consumption of reactive gas and the control unit 20, and a corresponding d.c. voltage signal is supplied to one of the coils 13, 14 or both via the lines 19. A stationary magnetic field is thus built up, which brings about the displacement of the electron beam 3 or respectively of its axis of rotation 34 in the direction of arrow 38. As the coating process reaches a steady state, the entire control method acts so that the axis of rotation 34 coincides with the axis 33 of the raw material source 4 and due to the rotation motion, the entire surface 32 is swept evenly by the electron beam 3.

In the illustrated example the raw material source 4 has for instance a diameter of 40 mm, and the displacement of the electron beam axis 17 relative to the axis 33 of the raw material source 4 is at most about 20 mm. Appropriately the rotating magnetic field is built up so that the electron beam 3 rotates about the axis of rotation 34 for instance at four revolutions per minute.

While a specific embodiment of the invention has been shown and described in detail to illustrate the application of the principles of the invention, it will be understood that the invention may be embodied otherwise without departing from such principles.

What is claimed is:

1. A method for centering an electron beam which is on a beam axis in a vacuum chamber of a vacuum coating installation, from a cathode to a surface of a raw material source in the chamber, the beam producing a focal spot on the surface of the raw material source which is heated and melted down at a vaporization rate, the raw material source having a source axis and being moved up in accordance with the melting down of the raw material source, the method comprising:
   producing a magnetic field which is approximately at a right angle to the beam axis;
   rotating the magnetic field in a plane lying approximately at a right angle to the beam axis for rotating the electron beam about a rotation axis which is approximately parallel to the beam axis;
   measuring variations in the vaporization rate of the raw material source; and
   bringing the rotation axis into coincidence with the source axis as a function of the variations in the vaporization rate.

2. A method according to claim 1, wherein the vaporization rate of the raw material source is measured indirectly by measuring fluctuations in the consumption of a reactive gas which is introduced into the vacuum chamber.

3. A method according to claim 1, including producing additional stationary magnetic fields which are approximately at right angles to the rotation axis for displacing the electron beam to bring the rotation axis into coincidence with the source axis.

4. A method according to claim 1, wherein the rotating magnetic field is produced by two crossing alternating magnetic fields which are phase-shifted relatively to each other by about 90°.

5. A method according to claim 3, wherein the rotating magnetic field is produced by alternating current and the stationary magnetic fields are produced by direct current.

6. A method according to claim 5, including deriving a measurement signal by measuring variations in the vaporization rate of the raw material source, the alternating current for producing the rotating magnetic field having an a.c. voltage signal and the direct current for producing the stationary magnetic fields having a d.c. voltage signal, the method including comparing the measurement signal with the a.c. voltage signal and, producing the d.c. voltage signal as a function of the comparison.

7. A method according to claim 6, including generating the rotating and stationary magnetic fields using a pair of magnetic coils which are positioned at approximately 90° to each other, the d.c. voltage signal being superimposed on the a.c. voltage signal and the direct current and alternating current being superimposed on each other and supplied respectively to the coils.

8. A vacuum coating apparatus comprising:
a vacuum chamber housing defining a vacuum chamber;
a raw material source having an exposed surface for movement into the vacuum chamber, the raw material source having a source axis extending through the exposed surface;
means connected to the source for moving the source into the vacuum chamber;
cathode means connected to the vacuum chamber housing for generating an electron beam in the vacuum chamber;
focusing means for focusing and guiding the electron beam along a beam axis from the cathode means to the exposed surface of the raw material source;
two first magnet coils mounted near the housing, each first magnet coil having an axis which extends approximately at a right angle to the beam axis with the axes of the two first magnet coils being at approximately right angles to each other;
two second magnet coils each closely associated with and having an axis extending parallel to one of said two first magnetic coils;
alternating current supply means connected to said two first magnetic coils for applying alternating current to said two first magnet coils for producing a rotating magnetic field in the vacuum chamber for rotating the electron beam about a rotation axis which extends approximately parallel to the beam axis, rotation of the electron beam causing movement of a focal spot of the beam on the exposed surface of the source, around the exposed surface;
direct current supply means connected to said two second magnet coils for producing stationary magnetic fields for displacing the rotation axis; and
control means connected to said direct current supply means for powering the second magnet coils to bring the rotation axis into coincidence with the source axis.

9. An apparatus according to claim 8, wherein the alternating current supply means supplies current which is phase-shifted by 90° to said two first magnet coils.

10. An apparatus according to claim 9, wherein each of said two first magnet coils is formed as a single coil with each respective one of said two second magnet coils, said alternating and direct current supply means superimposing alternating and direct current on said respective single coils.

11. An apparatus according to claim 9, including a reactive gas line connected to said housing for supplying reactive gas to the vacuum chamber, and a flowmeter connected in said reactive gas line for measuring the flow of reactive gas into the vacuum chamber, said control means including a control unit connected to said flowmeter for measuring the flow of reactive gas and adjusting the superimposed direct current as a function of flow to displace the rotation axis so that it coincides with the source axis.

* * * * *